United States Patent
Kitagawa

(12) 
(10) Patent No.: US 10,512,125 B2
(45) Date of Patent: Dec. 17, 2019

(54) MOUNTING TABLE AND SUBSTRATE PROCESSING APPARATUS

(71) Applicant: TOKYO ELECTRON LIMITED, Tokyo (JP)

(72) Inventor: Dai Kitagawa, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 466 days.

(21) Appl. No.: 14/977,001

(22) Filed: Dec. 21, 2015

(65) Prior Publication Data

US 2016/0198528 A1 Jul. 7, 2016

(30) Foreign Application Priority Data

Jan. 6, 2015 (JP) ................. 2015-000643

(51) Int. Cl.
| | |
|---|---|
| H05B 3/28 | (2006.01) |
| H01J 37/32 | (2006.01) |
| H01L 21/67 | (2006.01) |
| H01L 21/687 | (2006.01) |
| H05B 1/02 | (2006.01) |

(52) U.S. Cl.
CPC ........ *H05B 3/283* (2013.01); *H01J 37/32724* (2013.01); *H01L 21/67103* (2013.01); *H01L 21/67109* (2013.01); *H01L 21/68735* (2013.01); *H05B 1/0233* (2013.01); *H01J 2237/2007* (2013.01); *H05B 2213/06* (2013.01)

(58) Field of Classification Search
CPC .. H05B 3/283; H05B 1/0233; H05B 2213/06; H01L 21/68735; H01L 21/67103; H01L 21/67109; H01J 37/32724; H01J 2237/2007
See application file for complete search history.

(56) References Cited

U.S. PATENT DOCUMENTS

| | | | | |
|---|---|---|---|---|
| 2005/0133164 | A1* | 6/2005 | Fischer | H01J 37/32642 156/345.51 |
| 2012/0281334 | A1* | 11/2012 | Sasaki | H01L 21/6831 361/234 |
| 2014/0209245 | A1* | 7/2014 | Yamamoto | H01J 37/32091 156/345.53 |

FOREIGN PATENT DOCUMENTS

| | | |
|---|---|---|
| JP | 6-170670 A | 6/1994 |
| JP | 2000-236015 A | 8/2000 |
| JP | 2005-32858 A | 2/2005 |
| JP | 2007258500 A * | 10/2007 |
| JP | 2011-238682 A | 11/2011 |
| JP | 2012-80103 A | 4/2012 |

(Continued)

*Primary Examiner* — Kambiz Zand
*Assistant Examiner* — Mirza Israr Javed
(74) *Attorney, Agent, or Firm* — Rothwell, Figg, Ernst & Manbeck, P.C.

(57) ABSTRACT

Provided is a mounting table according to one aspect of the present disclosure includes: a ceramic body; a heater provided in the ceramic body; a base including a support surface that supports the ceramic body and provides a space for accommodating a temperature sensor as a space that is opened at least at the support surface side; and a heat transfer body extending between a first end provided in the ceramic body and a second end that is positioned above the space and provided closer to the space than the first end, the heat transfer body having a heat conductivity that is higher than that of the ceramic body around the heat transfer body.

15 Claims, 7 Drawing Sheets

(56) References Cited

FOREIGN PATENT DOCUMENTS

JP    2014-110378 A    6/2014

* cited by examiner

MOUNTING TABLE AND SUBSTRATE PROCESSING APPARATUS

CROSS-REFERENCE TO RELATED APPLICATIONS

This application is based on and claims priority from Japanese Patent Application No. 2015-000643, filed on Jan. 6, 2015, with the Japan Patent Office, the disclosure of which is incorporated herein in its entirety by reference.

TECHNICAL FIELD

An exemplary embodiment of the present disclosure relates to a mounting table and a substrate processing apparatus.

BACKGROUND

In a substrate processing apparatus a workpiece (e.g., semiconductor wafer, glass substrate, or the like) is processed in a state where the workpiece is mounted on a mounting table. It is important to control the temperature of the workpiece when such a workpiece is processed. Hence, a mounting table having a temperature regulating function has been widely used.

For example, an electrostatic chuck having a temperature control function is disclosed in Japanese Patent Publication No. 06-170670. An attraction electrode and a heater are embedded in this electrostatic chuck. When a voltage is applied from an external power source, the attraction electrode generates an electrostatic force to attract and hold a workpiece on a mounting surface of the electrostatic chuck. Further, the heater generates heat by a power supplied from a heater power source to heat the electrostatic chuck. A through-hole is forming in the electrostatic chuck to extend in a plate thickness direction, and a temperature sensor is inserted into the through-hole such that a front end portion thereof comes into contact with a rear surface side of the workpiece and measures the temperature of the workpiece. A temperature control and operation unit is connected to the temperature sensor. The temperature control and operation unit controls the heater power source depending on the temperature of the workpiece obtained from the temperature sensor, so that the temperature of the workpiece is controlled to a target temperature.

SUMMARY

According to an aspect, the present disclosure provides a mounting table including: a ceramic body; a heater provided in the ceramic body; a base including a support surface supporting the ceramic body and providing a space for accommodating a temperature sensor as a space that is opened at least at the support surface side; and a heat transfer body extending between a first end provided in the ceramic body and a second end that is positioned above the space and provided closer to the space side than the first end, the heat transfer body having a heat conductivity that is higher than that of the ceramic body around the heat transfer body.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

In the following detailed description, reference is made to the accompanying drawings, which form a part hereof. The illustrative embodiments described in the detailed description, drawing, and claims are not meant to be limiting. Other embodiments may be utilized, and other changes may be made without departing from the spirit or scope of the subject matter presented here.

The electrostatic chuck described in Japanese Patent Publication No. 06-170670 includes a through-hole formed to insert a temperature sensor therein. When such a through-hole is formed in the electrostatic chuck, a temperature singularity that locally varies in temperature occurs on the mounting surface of the electrostatic chuck. Therefore, in order to measure the temperature of measurement target points while suppressing the temperature singularity from occurring on the mounting surface of the electrostatic chuck, it is considered to adopt a mounting table configured as illustrated in FIG. 7.

Figure 7:
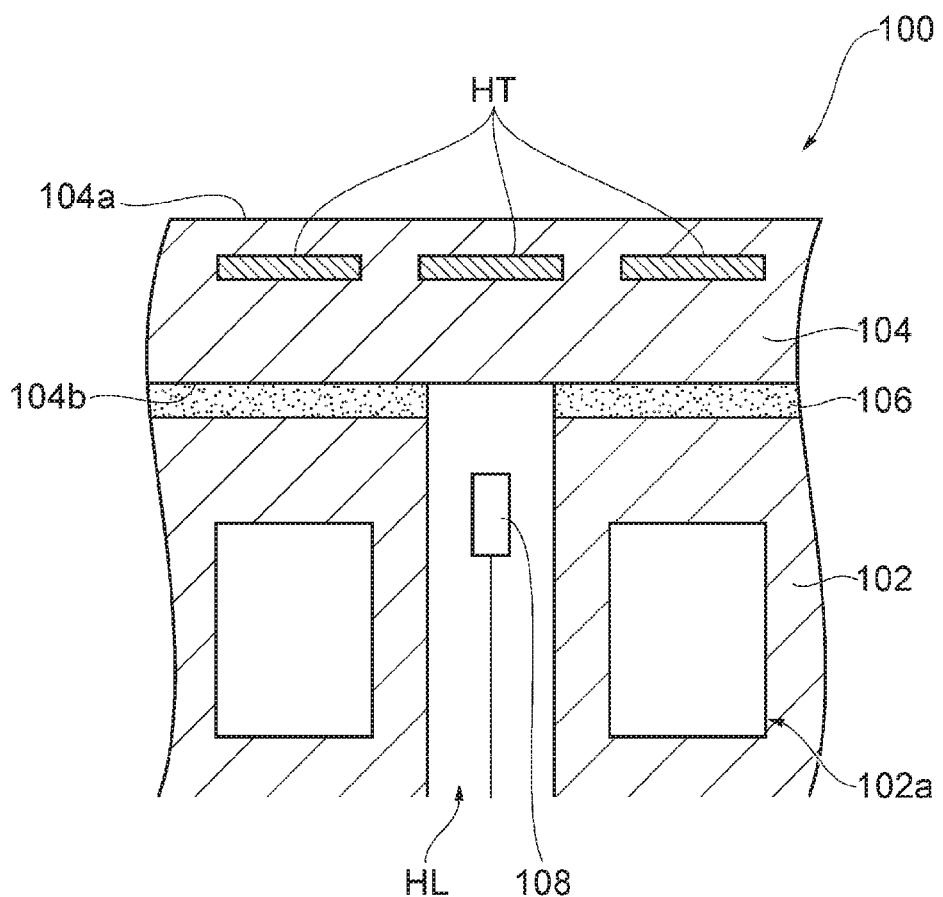
FIG. 7 is a schematic sectional view illustrating an example of a conventional mounting table.

A mounting table 100 illustrated in FIG. 7 is provided with a cooling plate 102. A coolant path 102a is formed in the cooling plate 102 to circulate a coolant. A ceramic plate 104 is provided on the cooling plate 102 via an adhesive 106. The ceramic plate 104 has an upper surface 104a and a lower surface 104b, and the upper surface 104a provides a mounting surface on which a workpiece is placed. A heater HT is provided within the ceramic plate 104. Further, a through-hole HL is formed in the cooling plate 102 to pass through the cooling plate 102 in the thickness direction thereof. A temperature sensor 108 is provided in the through-hole HL to measure the temperature of the lower surface 104b of the ceramic plate 104 in a non-contact manner. Since no through-hole is formed in the ceramic plate 104 in the mounting table 100 of FIG. 7, the temperature singularity may be suppressed from occurring on the mounting surface. Further, the temperature of a measurement target point in the ceramic plate 104 may be indirectly obtained by measuring the temperature of the lower surface 104b in the mounting table 100.

However, since the ceramic plate 104 has low heat conductivity, a large temperature gradient occurs between the measurement target point and the lower surface 104b.

Hence, it is difficult to precisely obtain the temperature of the measurement target point from the temperature of the lower surface 104b.

Accordingly, there is a demand for a mounting table capable of more precisely measuring a temperature of a measurement target point in the ceramic body in the related art.

According to an aspect, the present disclosure provides a mounting table including a ceramic body; a heater provided in the ceramic body; a base including a support surface that supports the ceramic body and provides a space for accommodating a temperature sensor as a space that is opened at least at the support surface side; and a heat transfer body extending between a first end provided in the ceramic body and a second end that is positioned above the space and provided closer to the space than the first end, the heat transfer body having a heat conductivity that is higher than that of the ceramic body around the heat transfer body.

In the mounting table according to the aspect, since the heat transfer body having a high heat conductivity is provided in the ceramic body, heat of the measurement target point in the ceramic body is efficiently transferred from the first end of the heat transfer body to the second end thereof. Thus, a temperature gradient between the measurement target point and the second end of the heat transfer body becomes smaller. That is, the temperature measured at the second end by the temperature sensor disposed in the space of the base comes closer to the temperature of the measurement target point. Therefore, by the mounting table according to the aspect, the temperature of the measurement target point may be more precisely measured.

According to an exemplary embodiment, the ceramic body includes a first ceramic layer provided on the support surface via the adhesive, and a second ceramic layer provided on the first ceramic layer. Here, the heater is provided in the second ceramic layer, and the heat transfer body is provided in the first ceramic layer. In this regard, the heat transfer body may have a heat conductivity higher than a heat conductivity of the first ceramic layer. Further, the first ceramic layer has a first surface disposed on the second ceramic layer, and a second surface disposed on a side opposite to the first surface. The first end of the heat transfer body may be provided on a boundary surface between the first ceramic layer and the second ceramic layer, and the second end of the heat transfer body may be located closer to the second surface than the first end.

According to an exemplary embodiment, the first end and the second end of the heat transfer body may be disposed at different positions in a direction perpendicular to a direction where the ceramic body is provided with respect to the base. Such a configuration makes it possible to measure the temperature of a measurement target point without a necessity of forming a space for accommodating a temperature sensor under the measurement target point. Therefore, since a position at which the space is formed may be optionally set, a degree of freedom in designing the mounting table may be enhanced.

According to an exemplary embodiment, the heat transfer body may be composed of a tungsten sintered body. Since the tungsten sintered body has a high heat conductivity, the heat of the measurement target point may be efficiently transferred. Further, since the tungsten sintered body has a coefficient of thermal expansion that is similar to a coefficient of thermal expansion of ceramics, thermal stress distortion may be suppressed from occurring between the heat transfer body and the ceramic body provided therearound when the mounting table is subject to a change in temperature. Therefore, in the configuration according to the exemplary embodiment, the heat transfer body and the ceramic body may be suppressed from being damaged due to the thermal stress distortion.

According to an aspect, the present disclosure provides a substrate processing apparatus including the mounting table as described above.

According to the aspect and various exemplary embodiments of the present disclosure, the temperature of the measurement target point in the ceramic body may be more precisely measured.

Hereinafter, various exemplary embodiments will be described in detail with reference to the accompanying drawings. The same reference numerals are used throughout the different drawings to designate the same or similar components.

Figure 1:
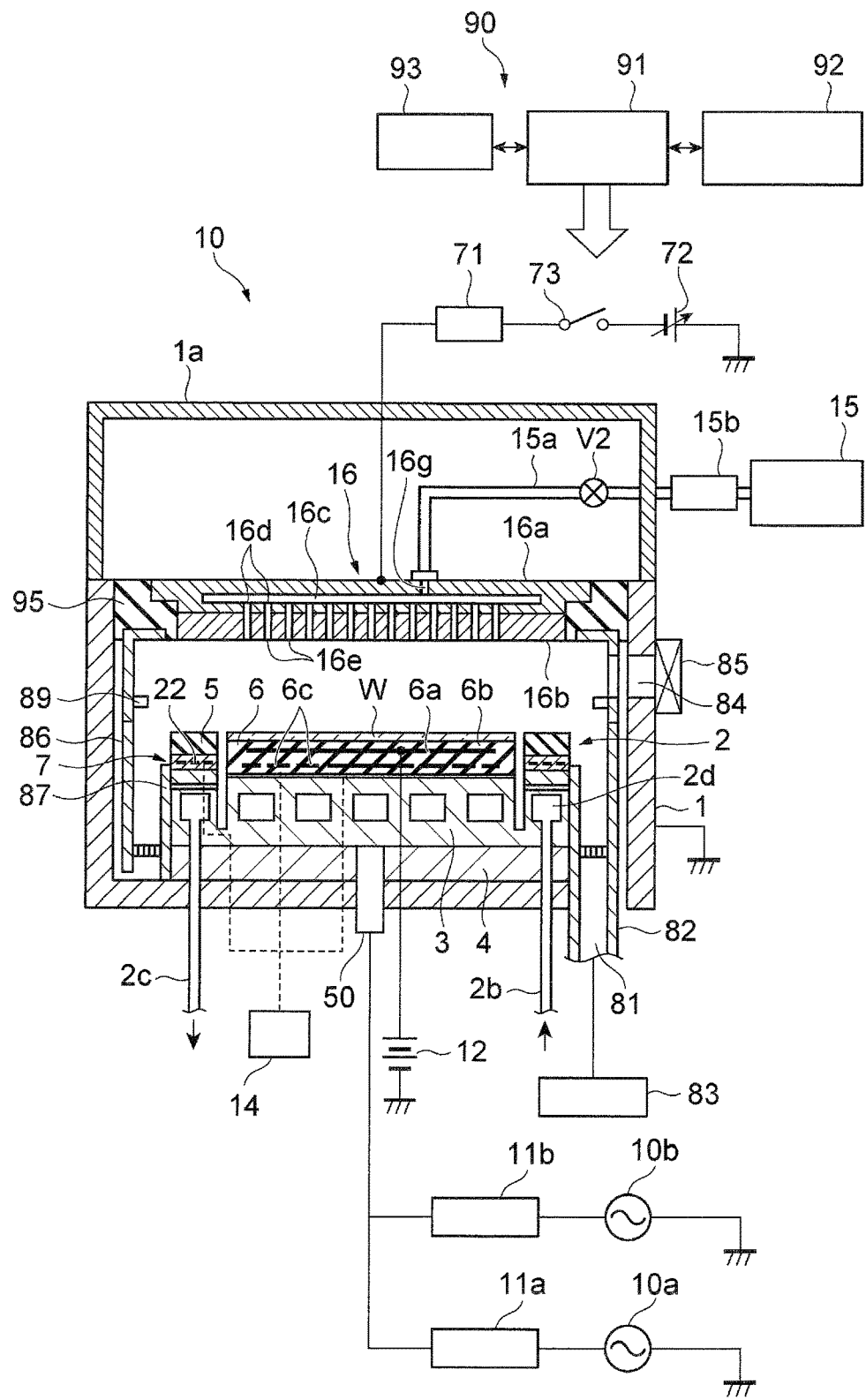
FIG. 1 is a schematic sectional view illustrating a configuration of a plasma processing apparatus according to an exemplary embodiment.

FIG. 1 is a schematic sectional view illustrating a configuration of a plasma processing apparatus that is a substrate processing apparatus according to an exemplary embodiment. The plasma processing apparatus illustrated in FIG. 1 has a processing container 1. The processing container 1 has a cylindrical shape and is made of for example, aluminum. The processing container 1 is, for example, electrically grounded. The processing container 1 defines a processing space in which plasma is generated. A mounting table 2 is accommodated in the processing space to horizontally support a workpiece, namely, a semiconductor wafer W (hereinafter, simply referred to as a "wafer"). The mounting table 2 according to an exemplary embodiment includes a base 3, an electrostatic chuck 6, and a ceramic body 7.

The base 3 has a substantially disc shape or a substantially cylindrical shape, and is made of a conductive metal such as, for example, aluminum. The base 3 is held on a support 4 of an insulator, and the support 4 is provided on a bottom portion of the processing container 1. The base 3 is fastened to the support 4 from the rear surface, for example, via a screw. This base 3 serves as a lower electrode.

A feeder rod 50 is connected to the base 3. A first RF power source 10a is connected to the feeder rod 50 through a first matching unit 11a. Further, a second RF power source 10b is connected to the feeder rod 50 through a second matching unit 11b. The first RF power source 10a is a power source for generating plasma, and is configured to supply high-frequency power of a predetermined frequency to the base 3 of the mounting table 2. Further, the second RF power source 10b is a power source for drawing ions (biasing), and is configured to supply high-frequency power of a predetermined frequency, which is lower than that of the first RF power source 10a, to the base 3 of the mounting table 2.

A coolant path 2d is formed in the base 3. A coolant inlet pipe 2b and a coolant outlet pipe 2c are connected to the coolant path 2d. Moreover, the mounting table 2 may be controlled to a predetermined temperature by circulating the coolant, for example, cooling water in the coolant path 2d. Further, a gas supply pipe for supplying cold-heat transfer gas (backside gas) such as for example, helium gas, to the rear surface of the wafer W may be provided to pass through the mounting table 2 or the like. The gas supply pipe is connected to a gas supply source. With such a configuration, the wafer W attracted and held on the upper surface of the mounting table 2 by the electrostatic chuck 6 may be controlled to a predetermined temperature.

The electrostatic chuck 6 is provided in the center of the mounting table 2 in a plane view from above, and functions to electrostatically attract the wafer W. The electrostatic chuck 6 has an electrode 6a and an insulator 6b. The electrode 6a is provided in the insulator 6b, which is made of, for example, ceramics. A DC power source 12 is connected to the electrode 6a. The electrostatic chuck 6 is configured to attract the wafer W by a Coulomb force, by applying a DC voltage from the DC power source 12 to the electrode 6a. One or more heaters 6c serving as heating elements are provided in the electrostatic chuck 6. The heaters 6c are connected to the heater power source 14. Each heater 6c extends, for example, in an annular shape to surround the center of the mounting table 2. For example, the heaters 6c may include a heater that heats a central region and a heater that extends in an annular shape to surround an outside of the central region. In this case, the temperature of the wafer W may be controlled at a plurality of regions that are radially located around the center of the wafer W.

Further, an annular focus ring 5 is provided outside the electrostatic chuck 6. The focus ring 5 is formed of, for example, single crystal silicon, and is supported on the base 3 via the ceramic body 7. One or more heaters 22 are provided in the ceramic body 7. The heaters 22 are heating elements for heating the focus ring 5. The heaters 22 are electrically connected to the heater power source 14. As such, the temperature of the wafer W and the temperature of the focus ring 5 are independently controlled by the different heaters.

Meanwhile, a shower head 16 serving as an upper electrode is provided above the mounting table 2 to face the mounting table 2. The shower head 16 and the mounting table 2 function as a pair of electrodes (i.e., upper and lower electrodes).

The shower head 16 is provided on a ceiling wall of the processing container 1. The shower head 16 is provided with a head body 16a and an upper hood plate 16b constituting the electrode plate. The shower head 16 is supported on an upper portion of the processing container 1 through an insulating member 95. The head body 16a is made of a conductive material, for example, aluminum of which the surface is anodized. The shower head is configured to detachably support the upper hood plate 16b under the head body 16a.

A gas diffusion chamber 16c is provided within the head body 16a. A plurality of gas through-flow holes 16d is formed in a bottom portion of the head body 16a to extend towards a lower portion of the gas diffusion chamber 16c. Further, a plurality of gas introduction holes 16e is formed in the upper hood plate 16b to pass through the upper hood plate 16b in a thickness direction thereof and thereby communicate with the plurality of gas through-flow holes 16d, respectively. By such a configuration, the processing gas supplied to the gas diffusion chamber 16c is dispersed in a shower form and supplied into the processing container 1 through the gas through-flow holes 16d and the gas introduction holes 16e.

Further, a gas inlet port 16g is formed in the head body 16a to introduce the processing gas into the gas diffusion chamber 16c. A gas supply pipe 15a is connected to the gas inlet port 16g. A processing gas supply source 15 is connected to the other end of the gas supply pipe 15a to supply the processing gas. A mass flow controller (MFC) 15b and a opening/closing valve V2 are provided on the gas supply pipe 15a in this order from the upstream side. A processing gas for plasma etching is supplied from the processing gas supply source 15 to the gas diffusion chamber 16c through the gas supply pipe 15a, and is supplied from the gas diffusion chamber into the processing container 1 16c through the gas through-flow holes 16d and the gas introduction holes 16e while being dispersed in a shower form.

The shower head 16 serving as an upper electrode is electrically connected with a variable DC power source 72 through a low pass filter (LPF) 71. The variable DC power source 72 is configured to turn on or off the power feeding by an on/off switch 73. The current and voltage of the variable DC power source 72 and the on/off operation of the on/off switch 73 are controlled by a controller 90 to be described later. Further, when a high frequency from the first RF power source 10a and the second RF power source 10b is applied to the mounting table 2 and plasma is generated in the processing space, the on/off switch 73 is turned on by the controller 90 as necessary, and a predetermined DC voltage may be applied to the shower head 16 as the upper electrode.

Further, a cylindrical grounding conductor 1a is provided in the plasma processing apparatus 10 to extend from a sidewall of the processing container 1 to a position above the shower head 16. The cylindrical grounding conductor 1a has a ceiling wall in its upper portion.

An exhaust port 81 is formed in the bottom portion of the processing container 1. A first exhaust device 83 is connected to the exhaust port 81 through an exhaust pipe 82. The first exhaust device 83 has a vacuum pump, and is configured to depressurize the interior of the processing container 1 to a predetermined vacuum level by operating the vacuum pump. Meanwhile, a carry-in/out port 84 for carrying in/out the wafer W is provided on a sidewall in the processing container 1. A gate valve 85 is provided in the carry-in/out port 84 to open or close the carry-in/out port 84.

A deposition shield 86 is provided along an inner wall surface inside the processing container 1. The deposition shield 86 prevents an etching byproduct (deposition) from adhering to the processing container 1. At a position that is substantially equal to the height of the wafer W of the deposition shield 86, a conductive member (GND block) 89 is provided to be controllably connected with an electric potential for grounding. This conductive member 89 prevents an abnormal discharge. Further, a deposition shield 87 is provided on a lower end portion of the deposition shield 86 to extend along the mounting table 2. The deposition shields 86 and 87 are detachably configured.

An operation of the plasma processing apparatus configured as described above is collectively controlled by the controller 90. The controller 90 is equipped with a process controller 91 that has a CPU to control respective parts of the plasma processing apparatus, a user interface 92, and a storage unit 93.

The user interface 92 is composed of a keyboard through which a process manager inputs a command to manage the plasma processing apparatus, a display on which the operating situation of the plasma processing apparatus is visually displayed, or the like.

The storage unit 93 stores a recipe that memorizes a control program (software) or processing condition data for realizing various processes executed in the plasma processing apparatus under the control of the process controller 91. Further, as necessary, any recipe is read out from the storage unit 93 by an instruction from the user interface 92 and then is executed in the process controller 91, so that a desired processing is performed in the plasma processing apparatus under the control of the process controller 91. Further, the recipe such as the control program or processing condition data may be stored in a computer storage medium (e.g., hard disc, CD, flexible disc, semiconductor memory or the like) that is readable by a computer, or may be frequently transmitted from another apparatus, for example, through a dedicated line, for on-line use.

Figure 2:
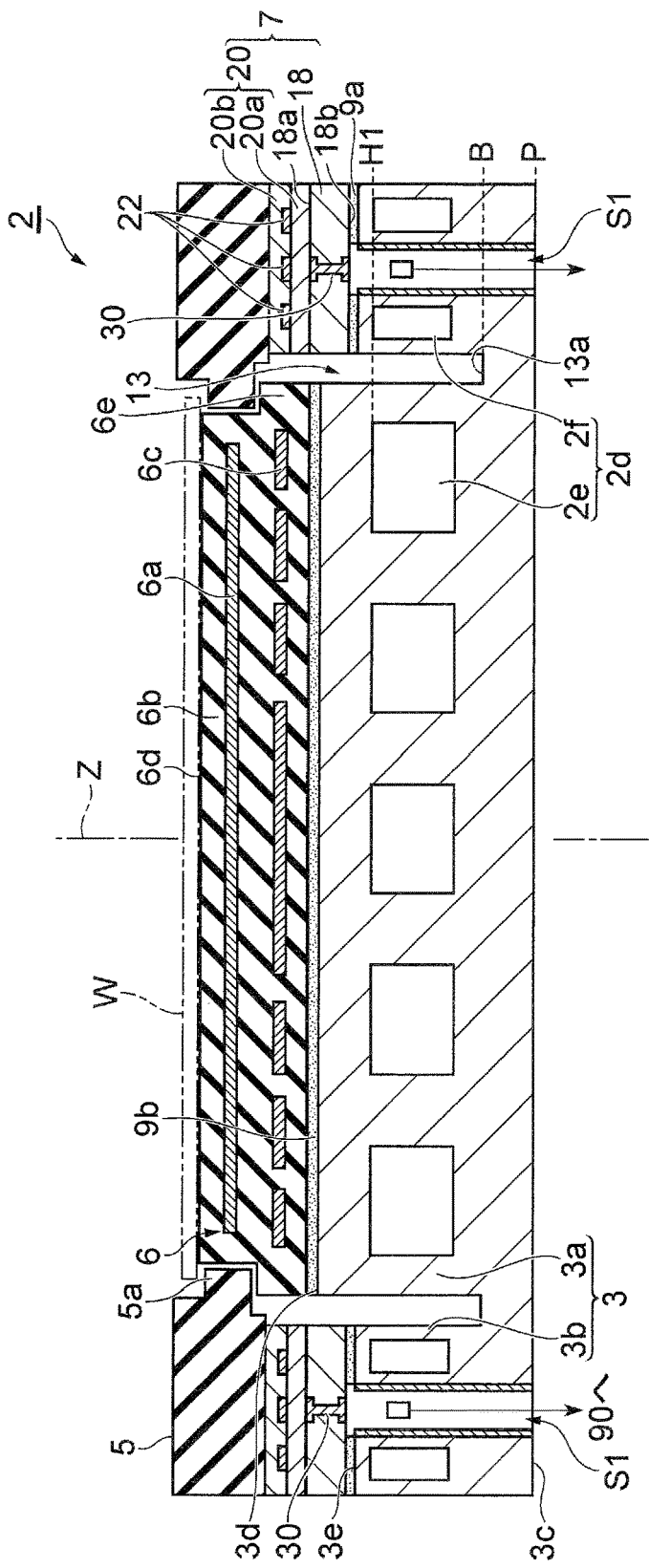
FIG. 2 is a schematic sectional view illustrating a mounting table according to an exemplary embodiment.

Next, the configuration of principal parts of the mounting table 2 will be described with reference to FIG. 2. FIG. 2 is a schematic sectional view illustrating the mounting table 2 in the plasma processing apparatus 10 of FIG. 1.

The base 3 has a substantially disc or cylindrical shape, and has a front surface (including an upper surface 3d and an upper surface 3e) that faces a rear surface 3c. As illustrated in FIG. 2, an annular groove 13 is formed at the front surface side of the base 3 to surround a central axis Z of the base 3. The groove 13 is formed in an annular shape when viewed in a direction perpendicular to the front surface of the base 3. Further, the groove 13 may be continuously or intermittently formed at the front surface side of the base 3 in a circumferential direction relative to the central axis Z. The upper portion of the base 3 is divided into a base central portion 3a and a base peripheral portion 3b by the groove 13.

When viewed in a direction perpendicular to the front surface of the base 3, the base central portion 3a has a circular shape, and includes a circular upper surface 3d that supports the electrostatic chuck 6. The central axis of the cylindrical base central portion 3a is identical with the central axis Z of the base 3. When viewed in a direction perpendicular to the surface of the base 3, the base peripheral portion 3b has an annular shape, and includes an annular upper surface 3e that supports the focus ring 5 through the ceramic body 7. The base peripheral portion 3b is formed to surround the central axis Z of the base 3, namely, the central axis of the base central portion 3a. As such, the surface of the base 3 is divided into the circular upper surface 3d and the annular upper surface 3e by the groove 13. The upper surface 3d is used as a support surface for supporting the electrostatic chuck 6, while the upper surface 3e is used as a support surface for supporting the ceramic body 7.

Figure 3:
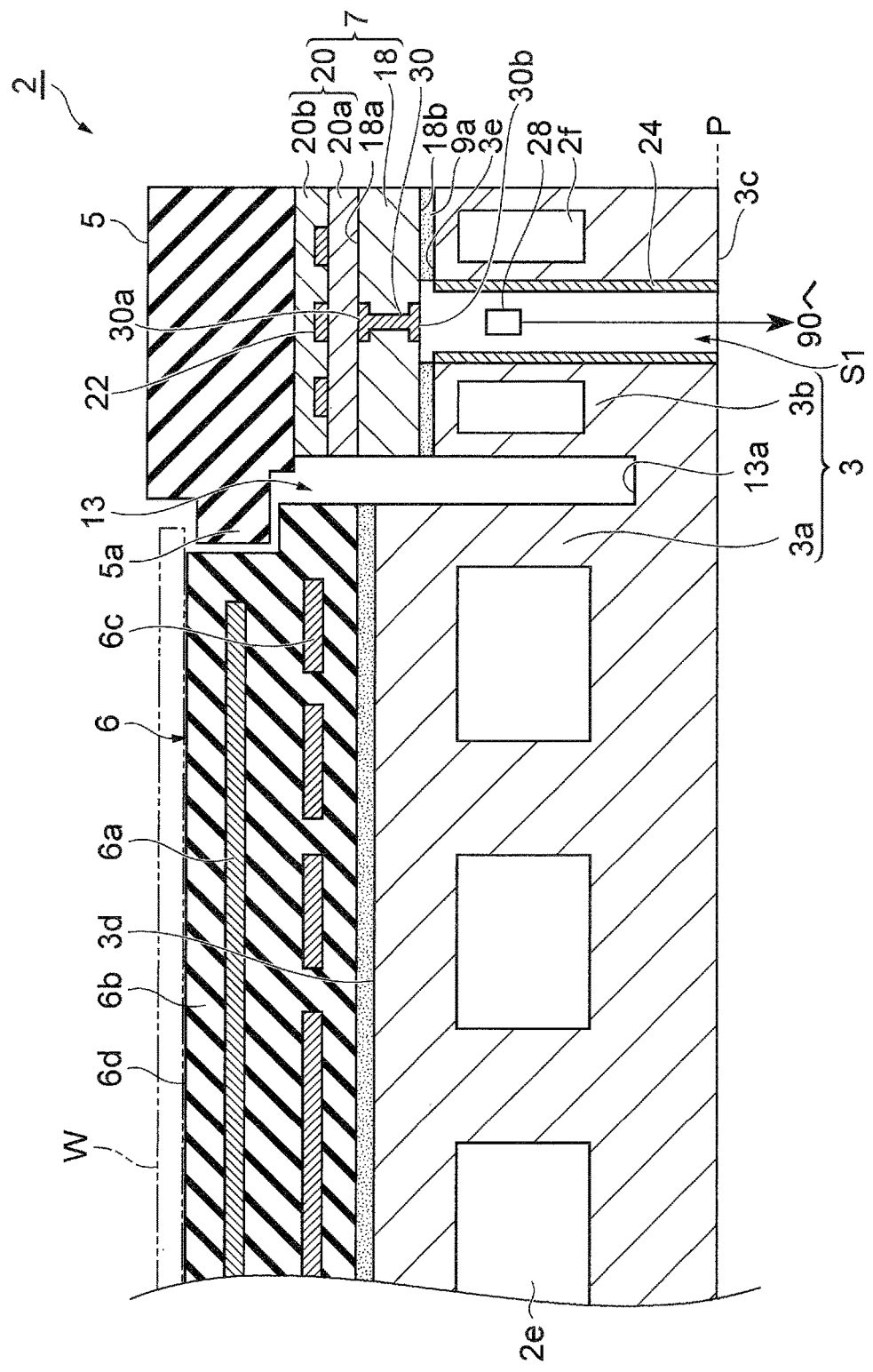
FIG. 3 is an enlarged sectional view illustrating a periphery of a temperature measurement mechanism of the mounting table illustrated in FIG. 2.

The height of the upper surface 3d and the upper surface 3e is appropriately adjusted such that heat transfer or RF power to the wafer W corresponds to heat transfer or RF power to the focus ring 5, depending on the thickness of the wafer W, the thickness of the focus ring 5, the thickness or physical properties of a material interposed between the wafer W and the base central portion 3a, or the thickness or physical properties of a material interposed between the focus ring 5 and the base peripheral portion 3b. That is, although FIG. 3 illustrates a case where the height of the upper surface 3d is different from that of the upper surface 3e, both of them may be identical with each other.

The coolant path 2d formed in the base 3 includes an inner coolant path 2e located closer to an inner side of the base 3 than the groove 13, and an outer coolant path 2f located closer to an outer side of the base 3 than the groove 13. The inner coolant path 2e is formed under the upper surface 3d of the base central portion 3a. The outer coolant path 2f is formed under the upper surface 3e of the base peripheral portion 3b. That is, the inner coolant path 2e is located under the wafer W to absorb heat from the wafer W, while the outer coolant path 2f is located under the focus ring 5 to absorb heat from the focus ring 5. Further, the inner coolant path 2e and the outer coolant path 2f may be connected to different cooling mechanisms such that coolants of different temperatures flow therethrough.

The groove 13 has a bottom surface 13a inside the base 3. That is, the base central portion 3a and the base peripheral portion 3b are connected to each other under the groove 13. Assuming that a height position P of the rear surface 3c of the base 3 is set as a reference, a height position B of the bottom surface 13a is set to be equal to the height of the upper end surface located at the uppermost side among the upper end surfaces of the coolant paths 2e and 2f, or to be under the height of the upper end surface located at the uppermost side among the upper end surfaces of the coolant paths 2e and 2f. FIG. 2 illustrates a case where the upper ends of the coolant paths 2e and 2f have the same height H. Hence, the height position B of the bottom surface 13a of the groove 13 is set to be equal to or lower than the height H1. Thus, since the groove 13 is formed at least up to the upper end surfaces of the coolant paths 2e and 2f, a space may be provided above the coolant paths 2e and 2f, and a horizontal heat flux in the base 3 may be blocked by disconnecting the physical continuity. Since the space becomes a vacuum space during the plasma processing, vacuum insulation is possible.

The base central portion 3a of the base 3 supports the electrostatic chuck 6 on its upper surface 3d. The electrostatic chuck 6 is provided to the upper surface 3d via an adhesive 9b. The electrostatic chuck 6 has a disc shape, and is provided coaxially with the central axis Z of the base 3. The mounting surface 6d is provided on an upper end of the electrostatic chuck 6 to mount the wafer W thereon. The mounting surface 6d has a circular shape, and comes into contact with the rear surface of the wafer W to support the disc-shaped wafer W. Further, a flange portion 6e is provided on the lower end of the electrostatic chuck 6 to protrude outwards in a radial direction of the electrostatic chuck 6. That is, the electrostatic chuck 6 has an outer diameter varying according to the height position of a side surface thereof. Further, the electrode 6a and the heater 6c are interposed in the insulator 6b of the electrostatic chuck 6. In the drawing, the heater 6c is provided under the electrode 6a. The mounting surface 6d is heated and controlled by the heater 6c.

The focus ring 5 is supported on the base peripheral portion 3b via the ceramic body 7. The focus ring 5 is an annular member, and is provided to be coaxial with the central axis Z of the base 3. A convex portion 5a is provided on an inner side surface of the focus ring 5 to protrude inwards in a radial direction thereof. That is, the focus ring 5 has an inner diameters varying according to the position of the inner side surface. For example, an inner diameter of a point where the convex portion 5a is not formed is larger than an outer diameter of the wafer W and an outer diameter of the flange portion 6e of the electrostatic chuck 6. Meanwhile, an inner diameter of a point where the convex portion 5a is formed is smaller than the outer diameter of the flange portion 6e of the electrostatic chuck 6 but is larger than an outer diameter of a point where the flange portion 6e of the electrostatic chuck 6 is not formed.

The focus ring 5 is disposed on the upper surface of the ceramic body 7 such that the convex portion 5a is spaced apart from the upper surface of the flange portion 6e of the electrostatic chuck 6 as well as the side surface of the electrostatic chuck 6. That is, gaps are formed between the lower surface of the convex portion 5a of the focus ring 5 and the upper surface of the flange portion 6e of the electrostatic chuck 6 and between the side surface of the convex portion 5a of the focus ring 5 and the side surface of the electrostatic chuck 6 where the flange portion 6e is not formed. Moreover, the convex portion 5a of the focus ring is located above the groove 13. That is, when viewed in a direction perpendicular to the mounting surface 6d, the convex portion 5a is present at a position where it overlaps the groove 13, to cover the groove 13. Therefore, the plasma may be suppressed from entering the groove 13.

The ceramic body 7 is mounted on the upper surface 3e of the base peripheral portion 3b. The ceramic body 7 supports the focus ring 5 on its upper surface. The ceramic body 7 has a stacking structure including a first ceramic layer 18 and a second ceramic layer 20.

The first ceramic layer 18 is provided on the upper surface 3e of the base peripheral portion 3b via the adhesive 9a. The first ceramic layer 18 may be composed of, for example, an alumina ($Al_2O_3$) ceramic sintered body made of formed by press molding. The first ceramic layer 18 has an upper surface (first surface) 18a and a lower surface (second surface) 18b that is opposite to the upper surface, and forms an annular shape that is coaxial with the central axis Z of the base 3. The lower surface 18b of the first ceramic layer 18 is attached to the upper surface 3e of the base peripheral portion 3b via the adhesive 9a. For example, a silicon-based or epoxy resin-based adhesive is used as the adhesive 9a. The adhesive 9a has, for example, heat resistivity in a range of 0.1 W/mK to 0.5 W/mK, and heat-resistant temperature in a range of 80° C. to 150° C. The adhesive 9a serves as a layer for absorbing stress strain, in addition to increasing heat resistance between the first ceramic layer 18 and the base peripheral portion 3b.

The second ceramic layer 20 is a ceramic layer provided on the upper surface 18a of the first ceramic layer 18, and forms an annular shape that is coaxial with the first ceramic layer 18. The focus ring 5 is disposed on the second ceramic layer 20. The second ceramic layer 20 may have a structure where a first film 20a and a second film 20b are stacked. The first film 20a and the second film 20b are ceramic films that are formed using a thermal spraying method. The thermal spraying method means a deposition method where a film is formed according to a spray material by spraying the particle-shaped spray material onto a surface of a substrate.

The first film 20a is, for example, a zirconia spray film that is formed by spraying zirconia ($ZrO_2$) particles onto the upper surface 18a of the first ceramic layer 18. The second film 20b is, for example, a yttria spray film that is formed by spraying yttria ($Y_2O_3$) particles onto the first film 20a. Since the second ceramic layer 20 is formed on the upper surface 18a of the first ceramic layer 18 by the thermal spraying method, the second ceramic layer 20 comes into close contact with the upper surface 18a of the first ceramic layer 18 to be integrated with the first ceramic layer 18. Further, the second ceramic layer 20 does not necessarily have the stacking structure, and may have a single-layered structure made of a single material.

One or more heaters 22 are provided in the second ceramic layer 20. Each heater 22 is formed in an annular shape that extends circumferentially relative to the central axis Z, and is disposed in the second film 20b to come into contact with a boundary surface between the first film 20a and the second film 20b. The heater 22 is a spray heater electrode formed by the thermal spraying method, for example, and serves as a heating element for heating the focus ring 5. According to an exemplary embodiment, the heater 22 is a tungsten heater electrode formed by spraying tungsten (W) particles onto the first film 20a.

Further, a temperature measurement mechanism is provided at the mounting table 2 to measure the temperature of a measurement target point in the ceramic body 7. The measurement target point is a location at which temperature is to be measured in the ceramic body 7.

An example of the temperature measurement mechanism will be described with reference to FIG. 3. FIG. 3 is an enlarged sectional view illustrating a periphery of the temperature measurement mechanism of the mounting table 2.

As illustrated in FIG. 3, a through-hole is formed in the base peripheral portion 3b of the base 3 to pass from the rear surface 3c to the upper surface 3e. An inner wall of the through-hole is covered by a tubular body 24. An inside of the through-hole defines a space S1 that is opened at the upper surface 3e side and the rear surface 3c side. Further, the space S1 has only to be opened at least at the upper surface 3e side, namely, the support surface side. For example, a concave portion may be formed in the base 3 to be dented from the upper surface 3e of the base peripheral portion 3b towards the rear surface 3c so that a space that is not opened at the rear surface 3c side but opened at the upper surface 3e side is defined.

The heat transfer body 30 is provided in the ceramic body 7. The heat transfer body 30 has a first end 30a and a second end 30b, and extends between the first end 30a and the second end 30b in the ceramic body 7. The first end 30a is provided at a measurement target point in the ceramic body 7, while the second end 30b is provided above the space S1 to be closer to the space S1 than the first end 30a. According to the exemplary embodiment illustrated in FIG. 3, the first end 30a is provided on the boundary surface between the first ceramic layer 18 and the first film 20a, while the second end 30b is provided at the height position of the lower surface 18b of the first ceramic layer 18 above the space S1.

The heat transfer body 30 transfers heat of the measurement target point in the ceramic body 7 from the first end 30a to the second end 30b. Hence, the heat transfer body 30 has a heat conductivity higher than a heat conductivity of the ceramic body around the heat transfer body 30, namely, the first ceramic layer 18. The heat transfer body 30 is composed of, for example, a tungsten sintered body. The heat transfer body 30 may be formed, for example, by sintering together with the first ceramic layer 18 when the first ceramic layer 18 is formed.

The temperature sensor 28 is accommodated in the space S1 defined by the base 3. For example, this temperature sensor 28 is provided to face the second end 30b of the heat transfer body 30 in the space S1 and detects the temperature of the second end 30b in a non-contact manner. Thus, the temperature sensor 28 detects a temperature approximate to the temperature of the measurement target point in the ceramic body 7. The controller 90 is electrically connected to the temperature sensor 28, and data on the temperature detected by the temperature sensor 28 is transmitted to the controller 90. According to an exemplary embodiment, the controller 90 may control a power supplied from the heater power source 14 to the heater 22 according to the temperature data transmitted from the temperature sensor 28. As such, the controller 90 controls the heater power source 14, so that the temperature of the measurement target point is controlled to a target temperature.

As described above, in the mounting table 2, the electrostatic chuck 6 is supported by the base central portion 3a, and the focus ring 5 is supported by the base peripheral portion 3b via the ceramic body 7. The first film 20a and the first ceramic layer 18 are interposed between the heater 22 of the ceramic body 7 and the base peripheral portion 3b. Since the interposition of the first film 20a and the first ceramic layer 18 leads to an increase in heat resistance between the heater 22 and the base peripheral portion 3b, a temperature gradient between the heater 22 and the base peripheral portion 3b is increased. That is, the heat flux from the heater 22 towards the base peripheral portion 3b is reduced. Hence, an increase in temperature of the adhesive 9a interposed between the first ceramic layer 18 and the base peripheral portion 3b is suppressed. Therefore, the ceramic body 7 and the focus ring 5 are suppressed from being detached from the base peripheral portion 3b when the temperature of the adhesive 9a exceeds the heat-resistant temperature.

Meanwhile, as the heat resistance between the heater 22 and the base peripheral portion 3b increases, the heat flux from the heater 22 towards the focus ring 5 increases. Hence, the temperature of the focus ring 5 may be increased by heating the heater 22 with small power. That is, the focus ring 5 may be efficiently heated.

Further, the heat transfer body 30 transmitting the temperature of the measurement target point to the second end 30b is provided in the first ceramic layer 18 of the mounting table 2. Since the heat transfer body 30 has a heat conductivity higher than that of the first ceramic layer 18, the heat of the measurement target point is efficiently transferred from the first end 30a to the second end 30b. Thus, the temperature gradient between the measurement target point in the ceramic body 7 and the second end 30b of the heat transfer body 30 becomes small. That is, the temperature measured from the second end 30b by the temperature sensor 28 provided in the space S1 is a temperature approximate to the temperature of the measurement target point. Therefore, the mounting table 2 configured as described above enables to more precisely measure the temperature of the measurement target point in the ceramic body 7.

Particularly, according to the exemplary embodiment, the heat transfer body 30 is composed of a tungsten sintered body. The tungsten sintered body has a coefficient of thermal expansion that is close to that of the alumina ceramic sintered body constituting the first ceramic layer 18. In this embodiment, thermal stress distortion is suppressed between the heat transfer body 30 and the first ceramic layer 18 when a change in temperature of the mounting table 2 occurs. Thus, the heat transfer body 30 and the first ceramic layer 18 may be suppressed from being damaged due to the thermal stress distortion.

Figure 4:
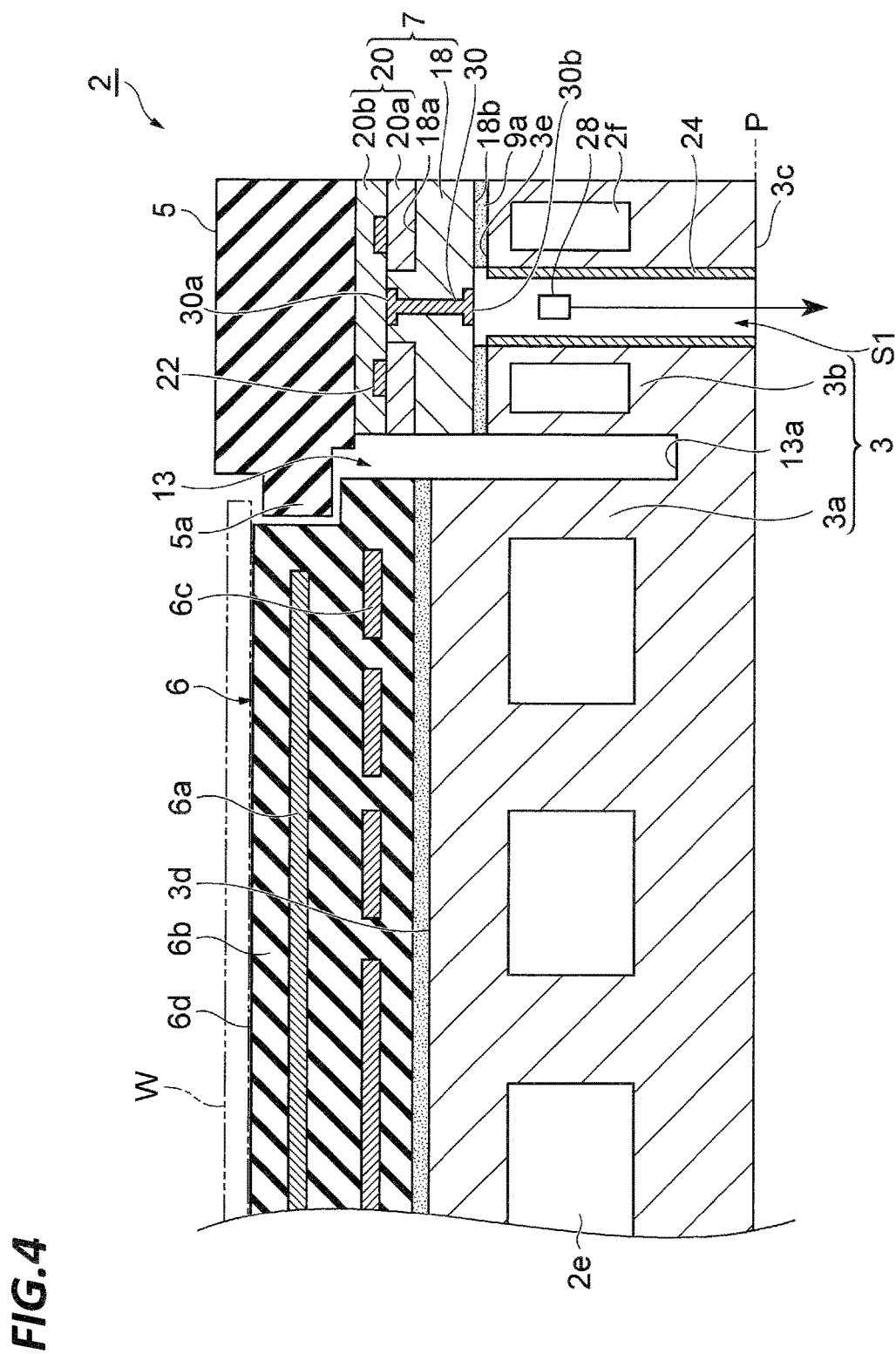
FIG. 4 is a schematic sectional view illustrating a configuration of a mounting table according to another exemplary embodiment.

Further, according to the exemplary embodiment illustrated in FIG. 3, the first end 30a of the heat transfer body 30 is disposed on the boundary surface between the first ceramic layer 18 and the first film 20a, but the position of the first end 30a is not particularly limited as long as it is located in the ceramic body 7. For example, when the first ceramic layer 18 and the second film 20b come into contact with each other above the space S1 as illustrated in FIG. 4, the first end 30a of the heat transfer body 30 may be disposed on the boundary surface between the first ceramic layer 18 and the second film 20b. In such an exemplary embodiment, by measuring the temperature of the second end 30b using the temperature sensor 28, the temperature of the boundary surface between the first ceramic layer 18 and the second film 20b may be more precisely measured. Further, according to an exemplary embodiment, in order to directly measure the temperature of the heater 22, the first end 30a of the heat transfer body 30 may be disposed to come into contact with the lower surface of the heater 22.

Figure 5:
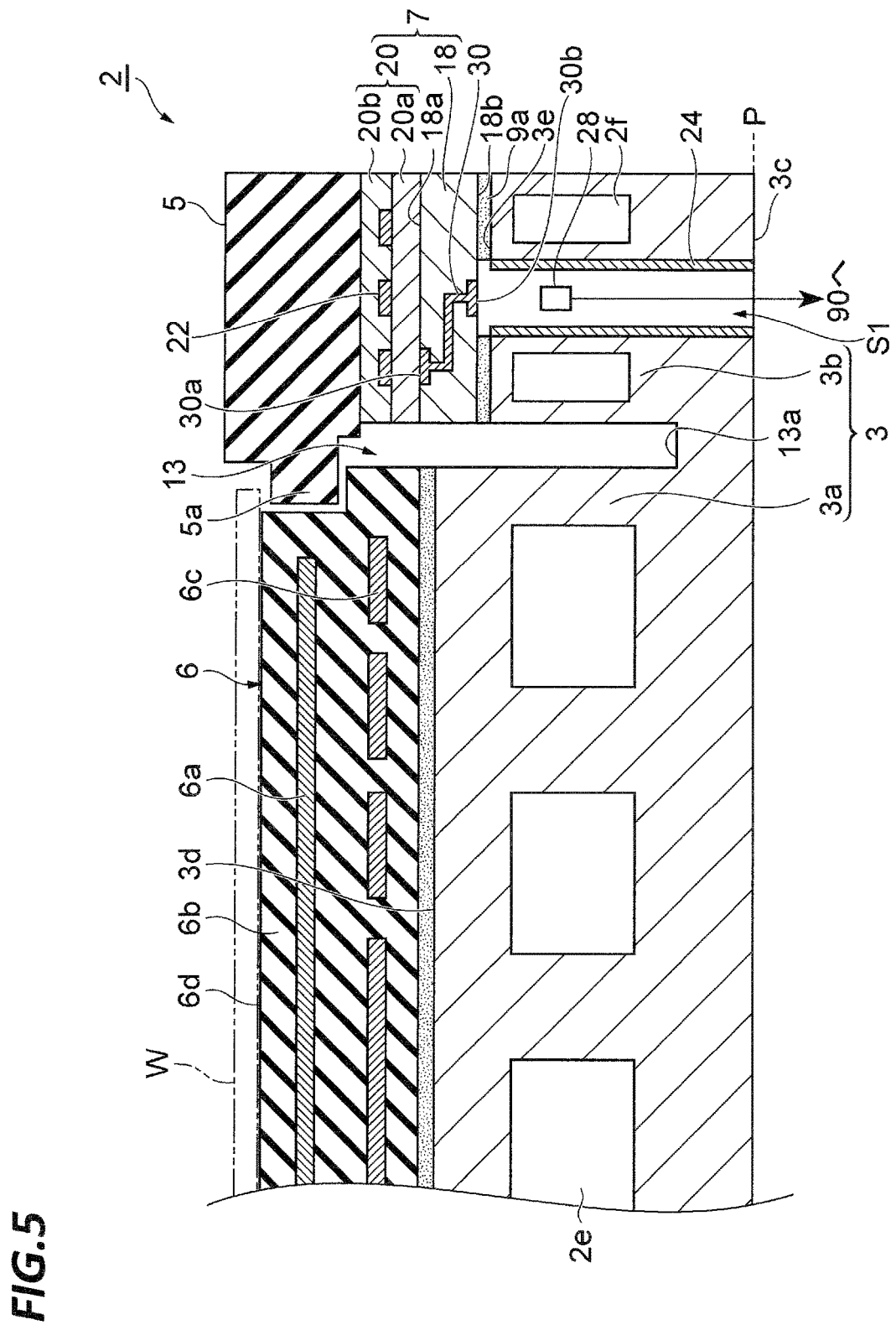
FIG. 5 is a schematic sectional view illustrating a configuration of a mounting table according to still another exemplary embodiment.

Further, according to an exemplary embodiment, the first end 30a and the second end 30b of the heat transfer body 30 may be disposed at different positions in a direction perpendicular to a direction where the ceramic body 7 is provided relative to the base 3 (a direction parallel to the central axis Z), namely, in a horizontal direction. For instance, as illustrated in FIG. 5, the second end 30b of the heat transfer body 30 may be located above the space S1, and the first end 30a of the heat transfer body 30 may be located at an inner position than the second end 30b in the radial direction of the mounting table 2. In the exemplary embodiment of FIG. 5, the temperature of the measurement target point may be measured without forming the space S1 for accommodating the temperature sensor 28 under the measurement target point. Accordingly, since the position where the space S1 is formed is able to be optionally set, the degree of freedom in designing the mounting table 2 may be enhanced.

Although the heat transfer body 30 is provided above only the base peripheral portion 3b in the exemplary embodiment, a further heat transfer body 30 may be provided above the base central portion 3a. A mounting table according to such a modification will be described with reference to FIG. 6. Hereinafter, a difference between the mounting table of FIG. 6 and the mounting table 2 of FIG. 2 will be mainly described, and a duplicated description thereof will be omitted herein.

Figure 6:
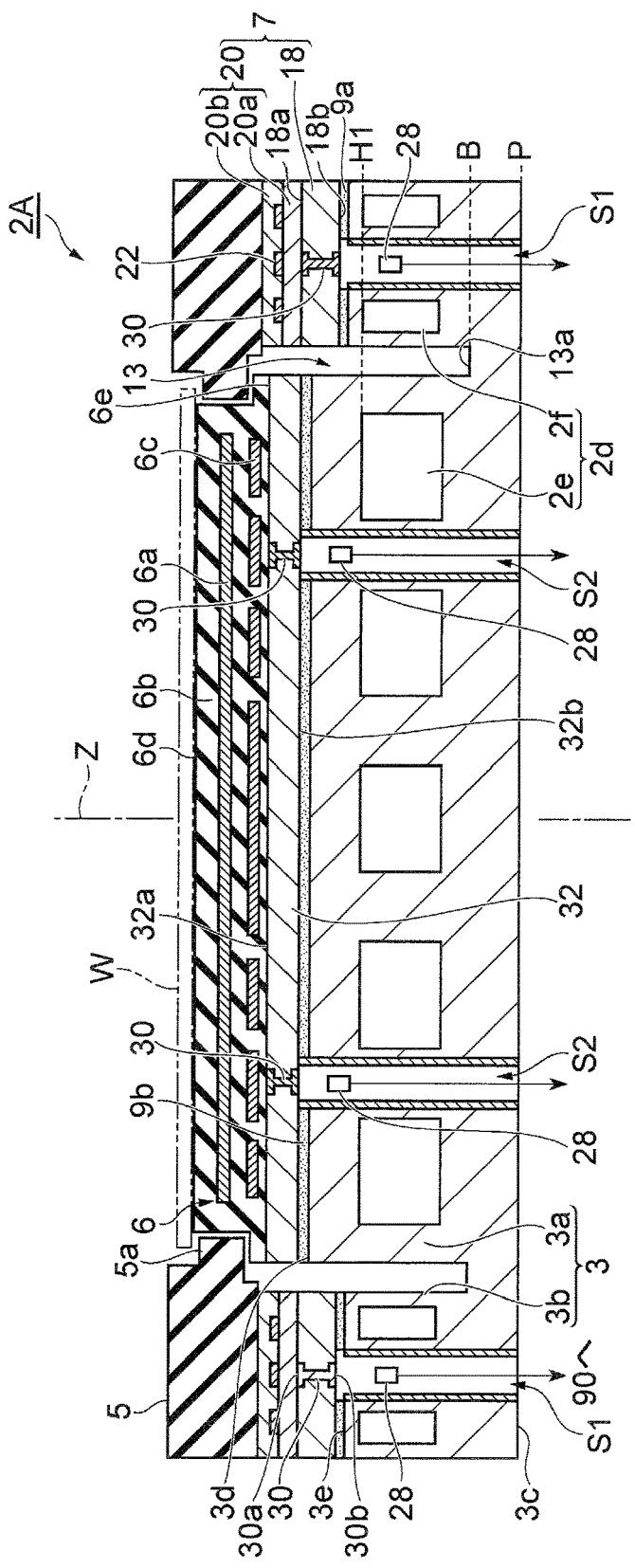
FIG. 6 is a schematic sectional view illustrating the configuration of a mounting table according to yet another exemplary embodiment.

FIG. 6 is a schematic sectional view illustrating a mounting table 2A according to the modification. In the mounting table 2A, the base central portion 3a of the base 3 supports on its upper surface 3d the electrostatic chuck 6 via a third ceramic layer 32. The third ceramic layer 32 has a substantially disc shape, and is composed of, for example, an alumina ceramic sintered body that is formed by press molding. The third ceramic layer 32 has an upper surface 32a and a lower surface 32b. The lower surface 32b is attached to the upper surface 3d of the base central portion 3a via an adhesive 9b. The third ceramic layer 32 serves as the ceramic body of the exemplary embodiment together with the electrostatic chuck 6.

Further, as illustrated in FIG. 6, a through-hole is formed in the base central portion 3a of the base 3 to pass from the rear surface 3c to the upper surface 3d. A space S2 is formed inside the through-hole, and is opened at the upper surface 3d and the rear surface 3c. As illustrated in FIG. 6, a plurality of spaces S2 may be formed in the base central portion 3a.

The heat transfer body 30 is provided in the third ceramic layer 32. The first end 30a of the heat transfer body 30 is provided on the boundary surface between the third ceramic layer 32 and the insulator 6b of the electrostatic chuck 6 above the space S2. The second end 30b of the heat transfer body 30 is located at the same height position as the lower surface 32b of the third ceramic layer 32 above the space S2. The heat transfer body 30 transfers heat on the boundary surface between the third ceramic layer 32 and the insulator 6b, which is the measurement target point, from the first end 30a to the second end 30b.

The temperature sensor 28 is accommodated in the space S2. For example, this temperature sensor 28 is provided to face the second end 30b of the heat transfer body 30 in the space S2, and detects the temperature of the second end 30b in a non-contact manner. The temperature sensor 28 is electrically connected to the controller 90, and transmits data on the detected temperature of the second end 30b of the heat transfer body 30 to the controller 90. According to an exemplary embodiment, the controller 90 may control a power supplied from the heater power source 14 to the heater 6c, according to the temperature data output from the temperature sensor 28. As such, the controller 90 controls the heater power source 14, so that the temperature of the measurement target point is controlled to the target temperature.

Similarly to the mounting table 2 illustrated in FIG. 3, the mounting table 2A of FIG. 6 may more precisely measure the temperature of the measurement target point of the electrostatic chuck 6. In the case of the mounting table 2A, the third ceramic layer 32 may not be provided between the base central portion 3a and the electrostatic chuck 6. In this case, the temperature of the measurement target point in the electrostatic chuck 6 may be more precisely measured by disposing the heat transfer body 30 in the insulator 6*b* of the electrostatic chuck 6.

Although various embodiments have been described hereinbefore, several modifications are possible without being limited to the above-mentioned embodiments. For example, the above-mentioned plasma processing apparatus 10 is a capacitively coupled plasma processing apparatus, but the mounting table 2 is applicable to another plasma processing apparatus. For example, the plasma processing apparatus to which the mounting table 2 is applied may be an inductively coupled plasma processing apparatus or a plasma processing apparatus in which gas is excited by surface waves such as microwaves.

According to the above-mentioned embodiment, the base central portion 3*a* and the base peripheral portion 3*b* are separated from each other by the groove 13. However, the base central portion 3*a* and the base peripheral portion 3*b* are not necessarily separated from each other. For example, the base central portion 3*a* and the base peripheral portion 3*b* may be physically continuous, and the base peripheral portion 3*b* may support the focus ring 5 via the ceramic body 7.

Further, according to the above-mentioned embodiment, the ceramic body 7 has the stacking structure including the first ceramic layer 18 and the second ceramic layer 20. However, the ceramic body 7 may have a single-layered structure. Even such a configuration allows heat of the measurement target point in the ceramic body 7 to be efficiently transferred from the first end 30*a* to the second end 30*b*, by the heat transfer body 30 provided in the ceramic body 7. Thus, the temperature of the measurement target point may be more precisely measured by measuring the temperature of the second end 30*b* of the heat transfer body 30 using the temperature sensor 28 provided in the space S2.

From the foregoing, it will be appreciated that various exemplary embodiments of the present disclosure have been described herein for purposes of illustration, and that various modifications may be made without departing from the scope and spirit of the present disclosure. Accordingly, the various exemplary embodiments disclosed herein are not intended to be limiting, with the true scope and spirit being indicated by the following claims.

What is claimed is:

1. A mounting table comprising:
a ceramic body;
a heater provided in the ceramic body;
a base including a support surface that supports the ceramic body, wherein the base further includes a space for accommodating a temperature sensor, and the space is at least at the support surface; and
a heat transfer body comprising a first end and a second end and extending from the first end to the second end, and wherein the first end is located in the ceramic body and the second end is positioned above the space and located closer to the space than the first end, the heat transfer body having a heat conductivity that is higher than that of the ceramic body around the heat transfer body,
wherein the ceramic body includes:
a first ceramic layer provided on the support surface via an adhesive; and
a second ceramic layer provided on the first ceramic layer, the heater is provided in the second ceramic layer,
the heat transfer body is provided in the first ceramic layer and has a heat conductivity higher than a heat conductivity of the first ceramic layer,
wherein the first ceramic layer includes a first surface disposed on the second ceramic layer, and a second surface disposed on a side opposite to the first surface, and
the first end of the heat transfer body abuts a boundary surface between the first ceramic layer and the second ceramic layer, and the second end of the heat transfer body is flush with the second surface of the first ceramic layer.

2. The mounting table of claim 1, wherein the first end and the second end of the heat transfer body are disposed at different positions in a direction perpendicular to a direction where the ceramic body is provided with respect to the base.

3. The mounting table of claim 1, wherein the heat transfer body is composed of a tungsten sintered body.

4. A substrate processing apparatus comprising the mounting table of claim 1.

5. The mounting table of claim 1, wherein the space is a through-hole formed in a base peripheral portion of the base to pass from the rear surface to the upper surface of the base in the base peripheral portion.

6. A mounting table comprising:
a ceramic body;
a heater provided in the ceramic body;
a temperature sensor;
a base including a support surface that supports the ceramic body, wherein the base includes a space accommodating the temperature sensor, and the space is open at least at the support surface, wherein the base includes a rear surface and an upper surface, and the base further includes a base peripheral portion; and
a heat transfer body comprising a first end and a second end and extending from the first end to the second end, and wherein the first end is located in the ceramic body and the second end is positioned above the space and located closer to the space than the first end, the heat transfer body having a heat conductivity that is higher than that of the ceramic body around the heat transfer body;
wherein the space is a through-hole formed in the base peripheral portion of the base to pass from the rear surface to the upper surface of the base in the base peripheral portion, and an inner wall of the through-hole is covered by a tubular body, and the tubular body surrounds the temperature sensor.

7. The mounting table of claim 1, wherein the heat transfer body is formed by sintering together with the first ceramic layer when the first ceramic layer is formed, such that the heat transfer body extends through the first ceramic layer from the first end of the heat transfer body to the second end of the heat transfer body.

8. The mounting table of claim 1, wherein a focus ring is disposed on the second ceramic layer.

9. The mounting table of claim 1, wherein the second ceramic layer includes a first film comprising a first material and a second film comprising a second material different from the first material are stacked, and
the first film and the second film are formed using a thermal spraying method, respectively.

10. The mounting table of claim 1, wherein the second ceramic layer comprises a first film and a second film which are stacked, and
the first film and the second film are formed of different materials from each other.

11. The mounting table of claim 1, wherein the first ceramic layer is a sintered layer and the second ceramic layer is a thermally sprayed layer.

12. The mounting table of claim 1, wherein the space is hollow.

13. The mounting table of claim 1, wherein the heat transfer body is embedded within the first ceramic layer.

14. A mounting table comprising:

a ceramic body;

a heater provided in the ceramic body;

a base including a support surface that supports the ceramic body, wherein the base further includes a space for accommodating a temperature sensor, and the space is open at least at the support surface; and a heat transfer body comprising a first end and a second end and extending from the first end to the second end, and wherein the first end is located in the ceramic body and the second end is positioned above the space and located closer to the space than the first end, the heat transfer body having a heat conductivity that is higher than that of the ceramic body around the heat transfer body;

wherein the ceramic body includes:

a first ceramic layer provided on the support surface via an adhesive; and a second ceramic layer provided on the first ceramic layer and including a first film adjacent the first ceramic layer and a second film provided on the first film, the heater is provided in the second film, and the heat transfer body is provided in the first ceramic layer and has a heat conductivity higher than a heat conductivity of the first ceramic layer, wherein the first ceramic layer includes a first surface adjacent to the second ceramic layer, and a second surface disposed on a side opposite to the first surface, and the first end of the heat transfer body is located at and abuts a boundary surface between the first ceramic layer and the second film layer, and the second end of the heat transfer body is flush with the second surface of the first ceramic layer of the transfer body.

15. The mounting table of claim 14, wherein positioning of the first ceramic layer between the second ceramic layer and the support provides an increase in heat resistance between the heater and the support surface such that a temperature gradient between the heater and the support surface is increased.

* * * * *